United States Patent [19]

Van Santen et al.

[11] Patent Number: 4,724,470
[45] Date of Patent: Feb. 9, 1988

[54] IMAGE SENSOR DEVICE HAVING SEPARATE PHOTOSENSOR AND CHARGE STORAGE

[75] Inventors: Johannes G. Van Santen; Marnix G. Collet, both of Eindhoven, Netherlands

[73] Assignee: U.S. Philips Corporation, New York, N.Y.

[21] Appl. No.: 324,735

[22] Filed: Nov. 25, 1981

Related U.S. Application Data

[63] Continuation of Ser. No. 79,911, Sep. 28, 1979, abandoned, which is a continuation of Ser. No. 872,080, Jan. 1, 1978, abandoned, which is a continuation of Ser. No. 684,678, May 10, 1976, abandoned.

[30] Foreign Application Priority Data

Jun. 9, 1975 [NL] Netherlands .......................... 7506795

[51] Int. Cl.[4] ...................... H01L 29/78; H01L 27/14; H01L 31/00; G11C 19/28
[52] U.S. Cl. .......................................... 357/24; 357/30; 377/60
[58] Field of Search ................. 357/24 LR, 24 M, 30; 377/57-63

[56] References Cited

U.S. PATENT DOCUMENTS

| | | | |
|---|---|---|---|
| 3,714,526 | 1/1973 | Low et al. | 357/30 |
| 3,813,541 | 5/1974 | Foss et al. | 357/30 |
| 3,845,295 | 10/1974 | Williams et al. | 357/24 LR |
| 3,856,989 | 12/1974 | Weimer | 357/24 LR |
| 3,896,474 | 7/1975 | Amelio et al. | 357/24 LR |
| 3,896,485 | 7/1975 | Early | 357/24 LR |
| 3,995,302 | 11/1976 | Amelio | 357/24 LR |
| 4,012,759 | 3/1977 | Esser | 357/24 M |
| 4,028,716 | 6/1977 | Van Santen et al. | 357/24 LR |
| 4,093,872 | 6/1978 | Hartman et al. | 357/24 LR |

OTHER PUBLICATIONS

Chamberlain, "High Speed Photoelement with Gain", IBM Technical Disclosure Bulletin, vol. 19 (4/77) pp. 4458-4460.

*Primary Examiner*—Gene M. Munson
*Attorney, Agent, or Firm*—Marc D. Schechter

[57] ABSTRACT

An image sensor of the interline type with a light sensor comprising a receptor, e.g. a current generating photo diode, and an integrator, e.g. an adjoining MOS capacitance, which are separated from each other spatially and a C.T.D. line separated therefrom.

5 Claims, 9 Drawing Figures

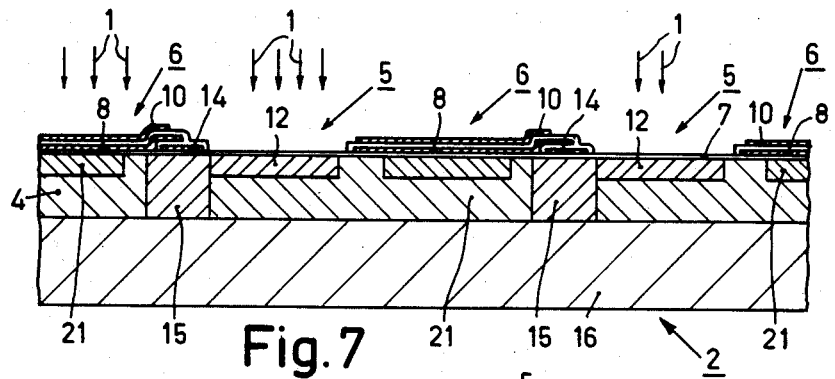
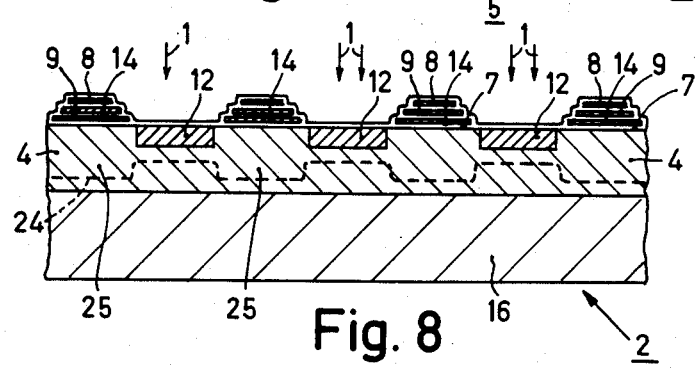
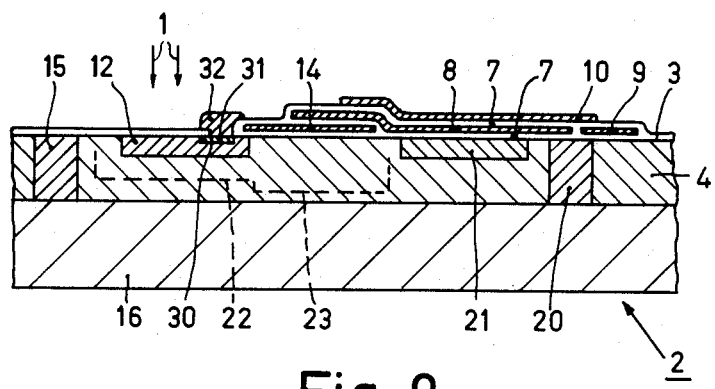

IMAGE SENSOR DEVICE HAVING SEPARATE PHOTOSENSOR AND CHARGE STORAGE

This is a continuation of application Ser. No. 079,911, filed Sept. 28, 1979, which is a continuation of application Ser. No. 872,080, filed Jan. 1, 1978, which is a continuation of application Ser. No. 684,678, filed May 10, 1976.

BACKGROUND OF THE INVENTION

The invention relates to an image sensor device for receiving a radiation image and converting same into an electric signal, comprising a semiconductor body having a surface layer of mainly one conductivity type in which a row of photo-sensitive elements is present which are each capable of absorbing incident radiation and converting it into charge carriers which can be stored in the photosensitive elements during a certain time interval, hereinafter termed frame time, and means for reading out the charge carriers stored in the photosensitive elements, said means comprising a charge transfer register having a series of electrodes which are provided on the surface of the layer, are separated from the layer by a barrier junction and form with the underlying semiconductor material a series of capacitances in which the information in the form of charge packets obtained in the photosensitive elements by generation of the charge carriers can be shifted to a read-out member, the device further including means for transferring the charge carriers in the photosensitive elements to the charge transfer register after each frame time.

The invention moreover relates to a photosensitive element suitable for use in an image sensor device as described above.

Image sensor devices based on the charge transfer principle are generally known. Such devices can be read electrically, instead of by means of an electron beam, by step-wise moving through the register the charge packets each containing information about the quantity of radiation which has locally been absorbed and sequentially reading at the output of the register. The charge transfer register may be formed, for example, by a so-called bucket brigade register, or by a charge coupled device.

Devices of the kind described above in which the photosensitive elements and the charge transfer register are separated from each other are sometimes referred to as image sensor devices of the interline type. A matrix structure of this type comprises a number of lines of photosensitive elements. Adjacent each line is an associated charge transfer register. These devices are distinguished from another type of image sensor device in which the functions of charge transfer and photosensitive element are not separated but in which the charge transfer register also provides the photosensitive elements. Separation of these functions, however, has several advantages. In particular, in a device of the interline type it is possible to obtain accurately defined integration times by simultaneously transferring, after each frame time, the charge packets stored in the photosensitive elements to the charge transfer register which can be screened against radiation. In addition, the parameters of the photosensitive elements and of the charge transfer register can be chosen more independently of each other, which may be very advantageous for improved performance of the device.

In spite of this, the possible choices of parameters of the photoresistive elements in this type of device are often still too restricted than would sometimes be desirable for an optimum operation of the device. For example, it is known to use photosensitive elements having an insulated gate electrode on the surface of the body which is insulated from the semiconductor material by an intermediate insulating layer of, for example, silicon oxide. By means of this insulated gate electrode a depletion region in which, or in the proximity of which, charge carriers can be generated and stored by absorption of radiation can be induced in the underlying semiconductor region. The sensitivity of such a device, however, can be detrimentally influenced by the insulated gate electrode when exposure is through the electrode surface. When a metal layer is used as an insulated gate electrode, the layer should in general be very thin since otherwise it becomes opaque to radiation. The provision of such thin metal layers often requires an extra manufacturing step during the production process.

The use of a semiconductor material, for example polycrystalline silicon, instead of metal has the advantage that the sensitivity of the device can be improved over a broad spectral range. Since, however, the absorption coefficient of silicon for shorter wavelength radiation is comparatively high, only a slight improvement for blue light can be obtained.

Absorption (and/or reflection) by the insulated electrodes can be prevented by receiving the radiation on the rear side of the semiconductor body. However, this usually requires an extra step during the production process to (at least locally) remove the semiconductor material on the rear side, for example by etching, to such an extent that incident radiation can penetrate into or at least near the depletion region induced by means of the insulated electrodes.

Instead of photosensitive elements having insulated electrodes, photosensitive diodes may also be used in the form of zones of the second conductivity type opposite to that of the semiconductor. These zones form photosensitive p-n junctions with the semiconductor layer, for example, as is usual in a silicon vidicon. The diodes can be charged electrically by applying a voltage in the reverse direction across the p-n junctions and then be discharged by absorption of incident radiation, charge carriers being generated which can provide information on the (local) intensity of the radiation.

However, photodiodes have the drawback that their charge storage capacity is often comparatively small, which means that less charge can be stored in the diodes than would be desirable. The principal reason for this is that the electric field strength across the insulating layer, for example silicon oxide, which in most of the cases is decisive of the breakdown in the charge transfer register, can in general be larger than the field strength in the semiconductor material itself. Avalanche multiplication of the semiconductor material generally occurs with comparatively low fields, as a result of which the favorable effect of the comparatively large dielectric constant on the diode capacitance is nullified entirely.

Increase of the charge storage capacity of the photo diodes by enlarging the area of the p-n junctions often results in an undesired decrease of the resolving power of the image sensor device and/or in an undesired enlargement of the semi-conductor body.

SUMMARY OF THE INVENTION

One of the objects of the present invention is to provide an image sensor device of the kind mentioned above for which the photosensitivity, especially for shortwave light, is comparatively good and for which the storage capacity is comparatively large so that the device can also be used advantageously with higher intensities of incident radiation without loss of information.

Another object of the invention is to provide a photosensitive element which is suitable for use in such an image sensor device and which combines a comparatively good sensitivity to shortwave light (blue) with a comparatively large charge storage capacity.

The invention is inter alia based on the discovery that the two major functions of the photosensitive element—namely the generation of charge carriers and the storage of the generated charge carriers—can be separated from each other and that, by splitting up the photosensitive elements into individual sub-elements for each of the major functions, the photosensitive element can be designed and/or operated more optimally than photosensitive elements in which these functions are not separated.

According to the invention, the photosensitive elements each comprise a photodiode having a surface zone adjoining the surface of the body and being of the second conductivity type opposite to the said one conductivity type and which diode forms a photosensitive p-n junction with the semiconductor layer of the one conductivity type, and an adjacent gate electrode in the form of a conductive layer which is provided on the surface and is separated from the semiconductor material by an intermediate insulating layer and, with the underlying material of the semiconductor layer, forms a capacitance in which charge carriers which are obtained during operation by absorption of radiation in the photodiode can be stored in the frame time before being transferred to the charge transfer register. Since the photodiodes mainly serve only for absorbing radiation and for the generation of charge carriers associated therewith, while the storage of said charge carriers mainly takes place in the region adjoining the photodiode below the insulated gate electrode, on the one hand the charge storage capacity of the photosensitive elements is not restricted by breakdown phenomena in the photodiodes, while the sensitivity of the device on the other hand is not reduced by the insulated gate electrode.

The invention will now be described in greater detail with reference to a few embodiments and the associated diagrammatic drawing, in which:

BRIEF DESCRIPTION OF THE DRAWING

FIG. 7 is a cross-sectional view taken on the line VII—VII of the device shown in FIG. 5;

FIG. 8 is a cross-sectional view taken on the line VIII—VIII of the device shown in FIG. 5;

FIG. 9 is a sectional view of a part of a third embodiment of a device according to the invention.

DESCRIPTION OF THE PREFERRED EMBODIMENTS

Figure 1:
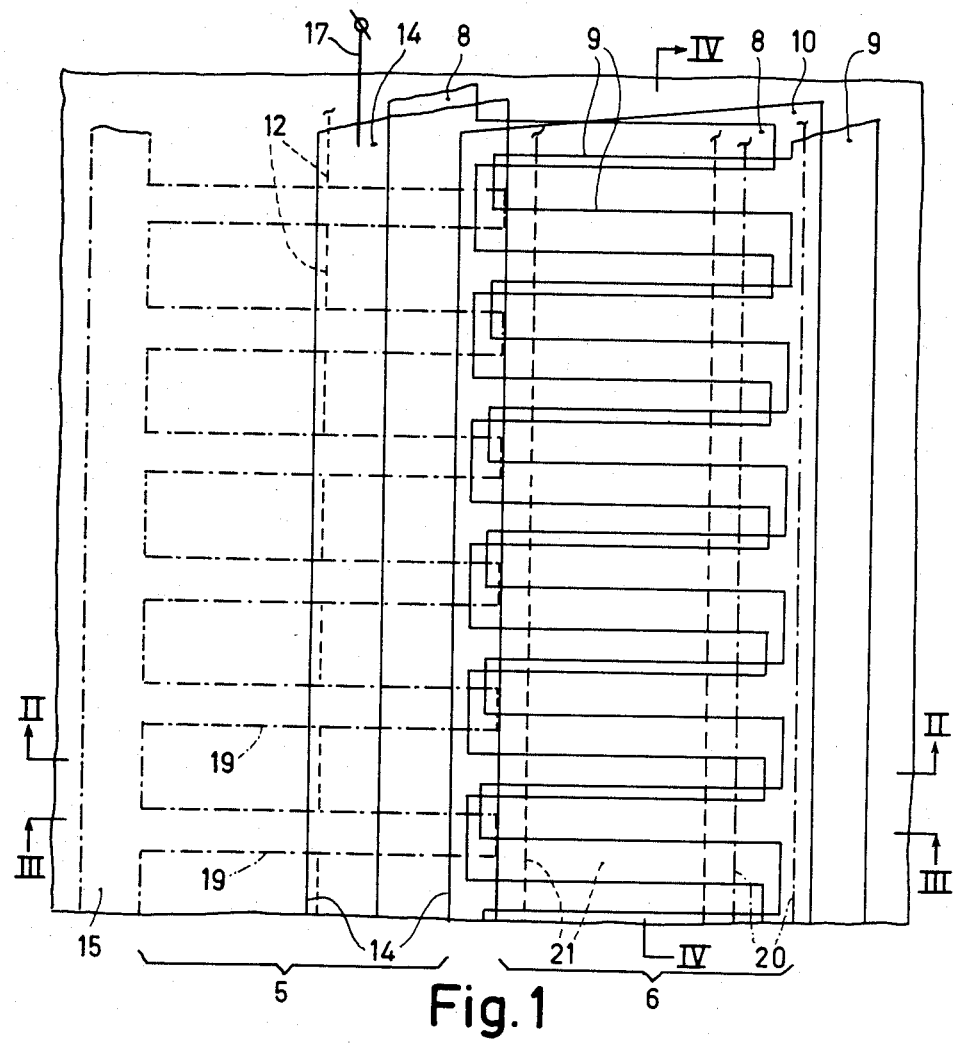
FIG. 1 is a plan view of a part of a linear picture pick-up device according to the invention.

FIG. 1 is a plan view of a linear image sensor device or line sensor according to the invention adapted to receive a linear radiation picture and to convert same into an electric signal. The radiation image which can be received via the upper side of the device is denoted diagrammatically by the arrows 1 in the cross-sectional view of FIG. 2. The device comprises a semiconductor body 2 of silicon but instead of silicon other suitable semiconductor materials may also be used. The body 2 comprises a surface layer 4 which adjoins the surface 3 and which is mainly of the n-conductivity type.

Arranged in and on the layer 4 is a row 5 of photosensitive elements which are each capable of absorbing and converting incident radiation 1 into charge carriers which, during an integration time or frame time, can be stored in the photosensitive elements in the form of charge packets before being read out.

The body 2 has read-out means including a charge transfer register 6. In the preferred embodiment this register is formed by a charge-coupled device having bulk transport, sometimes referred to in literature as a pccd or as a bccd. Of course, other types of charge transfer registers, for example bucket brigade memories or charge coupled devices having surface transport, may also be used. The charge transfer register comprises a series of electrodes 8, 9 and 10 provided on an insulating layer 7 which is provided on the surface 3 of the body 2 and which separates the electrodes from the underlying semiconductor material.

It is to be noted that the electrodes 8 and 9 are actually formed by the projecting portions of two comb-like electrode structures of which the strip-shaped base portions which interconnect the electrodes mutually are also denoted by reference numerals 8 and 9, respectively, for clarity. The electrodes 10 described by their reflectance properties hereinafter, are formed by a single strip-shaped conductive layer extending at least substantially over the whole surface of the charge transfer register. Furthermore it is to be noted that the insulating layer 7 which is assumed to be transparent and usually consists of silicon oxide but for which other materials may also be used, is not shown in FIG. 1 for clarity.

The electrodes 8, 9, 10 with the underlying semiconductor material of the semiconductor layer 4 form a series of capacitances by which the information obtained in the photosensitive elements 5 through generation of charge carriers in the form of charge packets can be shifted to the output 11 where the charge packets can be read out sequentially and converted into a video signal.

The sensor device according to the present embodiment therefore belongs to the type of sensors in which the photosensitive elements are laterally separated from the charge transfer register. As compared with sensor devices in which the charge transfer register also constitutes the photosensitive elements, this type of devices has important advantages, for example the advantage that after each frame time the charge packets can be shifted in the charge transfer register and can be protected therewith against incident radiation 1 during reading out. To accomplish this, the electrodes 10 are in the form of an elongate strip which covers substantially the whole surface of the charge transfer register. The strip 10 may advantageously be manufactured from a reflective material, for example aluminum.

According to the invention, the photosensitive elements of the row 5 each comprise a photodiode having a p-type surface zone 12 which adjoins the surface 3 and which forms a photosensitive p-n junction 13 with the n-type semiconductor layer 4, and a gate electrode 14 which is provided on the insulating layer 7 annd is laterally adjacent the corresponding photodiode. In the embodiment described the gate electrodes 14 are constructed as a continuous elongate strip of a conductive material, but it will be obvious that the gate electrodes 14 may also be provided in the form of a number of layers of a conductive material which are separated from each other. The gate electrodes 14 together with the underlying material of the semiconductor layer 4 form a series of capacitances in which charge carriers, obtained by absorption of radiation in and/or near the p-n junctions 13, can be stored during the frame time before being transferred to the charge transfer device 6.

The p-type zones 12 comprise an electric connection 15, 16 and the gate electrode or gate electrodes 14 comprise an electric connection 17. Via said connections, voltages can be applied—independently of each other—to the zones 12 and the gate electrodes 14, which voltages are desired with a view to a favorable operation of the device. As shown in the Figures, the p-type surface zones 12 are not each provided with an individual connection but with a connection which is common for all the zones 12 of the row 5. For example, the connection 17 also forms a common connection for the gate electrodes 14.

The connection connection 15, 16 of the p-type surface zones is formed by an adjoining p-type surface region 15 which extends from the surface 3 to the side of the layer 4 opposite to the surface 3. On this side the p-type region is connected to the p-type part 16, hereinafter termed substrate, of the semiconductor body which forms the p-n junction 18 with the n-type semiconductor layer 4 and with the p-type surface region 15 forms part of the electric connection 15, 16 of the p-type surface zones 12.

The charge storage regions of the photosensitive elements are formed by the parts of the semiconductor layer 4 which are present below the p-type surface zones 12 and the adjoining gate electrodes 14. For that purpose, the thickness and the doping concentration of the semiconductor layer 4 at the area of the photodiodes 12 and the gate electrodes 14 are chosen to be so low that depletion regions can be formed which extend throughout the thickness of the semiconductor layer 4 and form charge storage spaces for electrons.

In addition the region 15 forms a lateral boundary of the photosensitive elements. The mutal boundary between the photosensitive elements is formed by the p-type fingers 19 which extend from the region 15 laterally into the layer 4 and which from the surface 3 also extend down to the substrate 16. From the region 15 the fingers 19 extend below the gate electrodes 14 down to the charge transfer register 6. The charge storage sites below the gate electrodes 14—which are preferably located between the photodiodes 12 and the charge transfer register so as to obtain a structure in the longitudinal direction of the line which is as compact as possible—are also separated from each other by the p-type fingers 19.

In a specific embodiment of a device according to the present example, the semiconductor subtrate 16 has a thickness of approximately 250 $\mu$m and a doping concentration of approximately $2 \times 10^{14}$ atoms/cc. The remaining dimensions are assumed to be sufficiently large as is necessary to accomodate the number of photosensitive elements desired. In this specific example the n-type semiconductor layer 4 is formed by an epitaxial layer which is deposited on the substrate 16 and has a thickness of approximately 2 $\mu$m and a doping concentration of approximately $10^{15}$ atoms/cc. Besides by epitaxy, such a layer could of course also be obtained by means of ion implantation of suitable atoms, for example arsenic, in the substrate 16.

The p-type region 15, the doping concentration of which is not critical, can be obtained by diffusion of boron atoms at the surface 3 of the semiconductor body 1. Simultaneously with the p-type region 15, the p-type insulation region 20 can be diffused to form a part of the lateral boundary of the charge transfer register.

Figure 4:
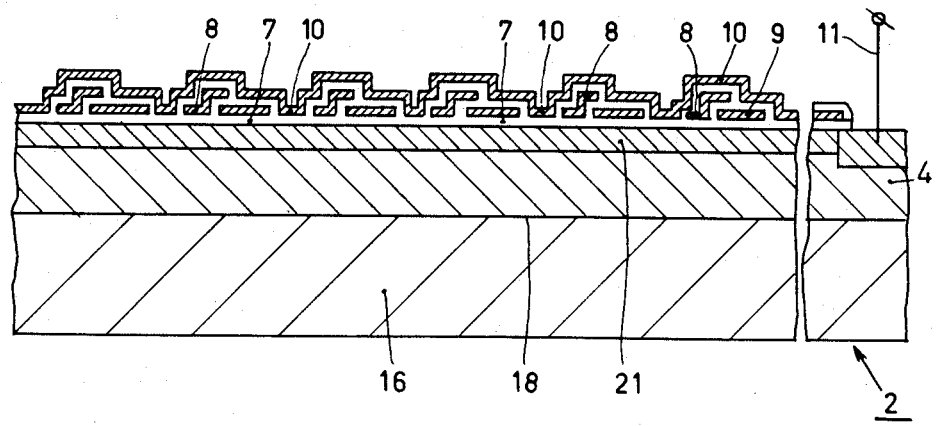
FIG. 4 is a cross-sectional view taken on the line IV—IV of the device shown in FIG. 1.

The p-type surface zones 12 can be obtained for example, by means of implantation of a p-type impurity in the epitaxial layer 4 with an implantation dose of approximately $10^{14}$ atoms/cm$^2$ and an implantation depth of approximately 0.3 $\mu$m. Also by means of ion implantation, the doping concentration of the surface region 21 of the epitaxial layer 4 at the surface 3 can be increased in the charge transfer device with an implantation dose of approximately $2 \times 10^{12}$ atoms/cm$^2$ and an implantation depth of approximately 0.3 $\mu$m. As shown in FIG. 4, the more heavily doped region 21 extends along substantially the whole surface of the charge transfer register and, as described inter alia in U.S. Pat. No. 4,012,759 serves to increase the charge capacity of the charge coupled devices. The more highly doped region 21 is shown in broken line in FIG. 1.

The insulating silicon oxide layer 7 has a thickness of approximately 0.1 $\mu$m. The electrodes 14, 9 and 8 are formed by layers of doped polycrystalline silicon which are provided after each other and have been patterned in the usual manner by means of photolithographic etching. The mutual insulation between the various sub-layers is formed by silicon oxide which has been obtained by partial oxidation of the polycrystalline silicon layers. The electrode 10 of the charge transfer register is formed by a layer of aluminum. Simultaneously with the provision of that electrode, contacts, for example the output contact 11 (see FIG. 4), can also be provided.

During operation the substrate is set up, for example, at a reference potential, for example ground (zero volt), while a voltage of approximately 16 volts is applied to the epitaxial layer 4 via the output contact 11, and clock voltages varying between 1.5 volts and $-8$ volts are applied to the electrodes 8, 9 and 10 of the charge coupled device. Clock voltages which vary between 11 volts and 1.5 volts are applied to the electrode 14.

At these voltages, the whole region of the epitaxial layer 4 which is covered by the photosensitive elements and by the charge transfer register will be depleted, i.e. substantially all the electrons present in said region are drained via the output contact 11 without generation of electrons. During the so-called integration period or frame period a voltage of approximately $+11$ volts is applied to the electrode 14, while a voltage of 0-volt is applied to the p-type zones 12 via the p-type zones 15 and the p-type substrate 16. A potential pattern (for electrons) is obtained below the p-type zones 12 and the electrodes 14, which pattern is shown in broken lines in FIG. 2 and shows a minimum 23 below the gate electrode 14. The radiation 1 is incident on the photodiodes 12 and generates hole-electron pairs near the reverse p-n junctions 13. Since no electrodes are present above the zones 12, the sensitivity to light of smaller wavelength (blue light) is also comparatively high. The holes of the generated electron-hole pairs are drained to the p-type zones 12 and 15 and/or to the substrate 16. The generated electrons can be collected in the potential walls 23 to the zones 12. The charge storage capacity below the electrodes 14 is approximately $10^{12}$ electrons per cm$^2$ and is considerably larger than the charge storage capacity below the p-type zones 12 which is approximately only $2 \times 10^{11}$ electrons per cm$^2$. The device therefore combines a good photosensitivity with a large charge capacity per unit area by separating the functions of absorption of radiation and the storage of charge carriers.

Figure 2:
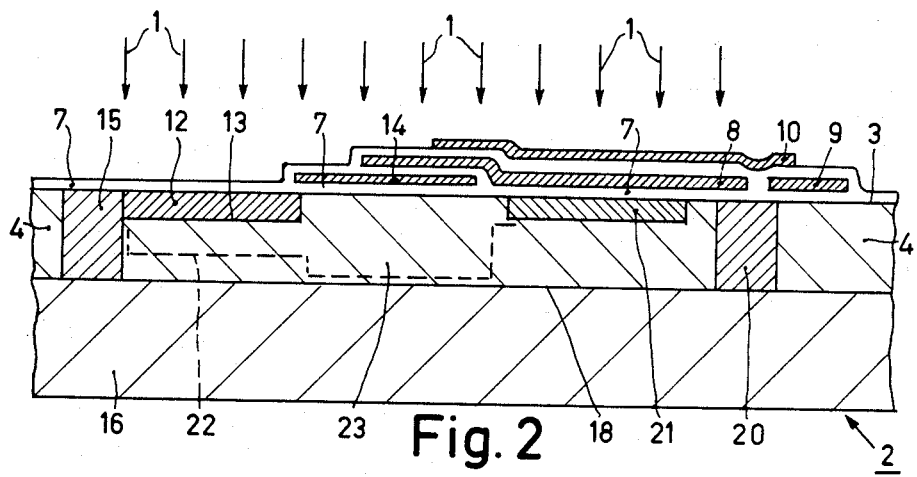
FIG. 2 is a cross-sectional view taken on the line II—II of the device shown in FIG. 1.
Figure 3:
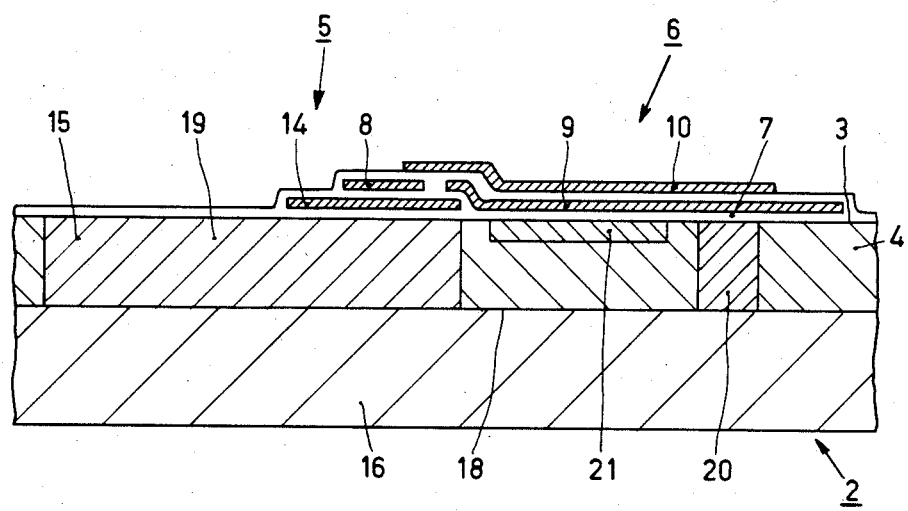
FIG. 3 is a cross-sectional view taken on the line III—III of the device shown in FIG. 1.

After the frame period the voltage at the electrodes 14 can be reduced to approximately +1.0 volt, while simultaneously the voltage at the adjacent electrode of the charge coupled device, for example the electrode 8 in FIG. 2, is increased to 1.5 volts, the remaining ones at $-8.5$ volts. The electrons which are generated and stored in the photosensitive elements of the row 5 are then transferred to the charge coupled device. The charge storage capacity in the charge transfer register per unit cell at the applied voltage is of the same order as that of the photosensitive elements.

In the usual charge transport manner the electrons generated in various photosensitive elements can be transported packet-wise to the output 11 and be read out sequentially there. The charge transport takes place mainly in the interior of the semiconductor layer, at a finite distance from the surface 3, as a result of which loss of information as a result of surface states is avoided.

It is to be noted that in the device described the charge transfer register 6 only serves to read out the generated charge and does not itself constitute the photosensitive elements. As a result of this it is possible to cover the register 6 with a radiation-impermeable layer which is formed in the embodiment by the electrode 10. The charge packets which are shifted in the register 6 after the frame period can advantageously be screened against radiation 1. Smearing the charge packets during reading out is hence avoided at least for the greater part in this type of sensor device.

As already noted, the device described relates to a line sensor for receiving a linear radiation picture. In order to make the compactness of the device in the longitudinal direction of the line as large as possible, the photodiodes 12 and the associated gate electrodes are juxtaposed in a direction transverse to the longitudinal direction of the line in such manner that the gate electrodes 14 are present between the diodes 12 and the charge transfer device 6.

The device as described with reference to the present embodiment can be extended to a two-dimensional picture sensor by simply juxtaposing a number of the line sensors shown. Such a device presents important advantages inter alia in those cases in which the number of picture dots in the longitudinal direction of the lines is larger than in the direction at right angles to the longitudinal direction.

In those cases in which the number of picture dots in the said longitudinal direction is smaller than or even of the same order of magnitude as the number of picture dots in the other direction, it is to be preferred to make the device in the same other direction as compact as possible. An embodiment of a two-dimensional image sensor according to the invention will now be described with reference to FIGS. 5-8, in which the density of the picture dots in a direction transverse to the longitudinal direction of the lines can be larger than in the line sensor according to the first embodiment. For simplicity, in this embodiment the same reference numerals are used for corresponding components as in the first embodiment.

Figure 5:
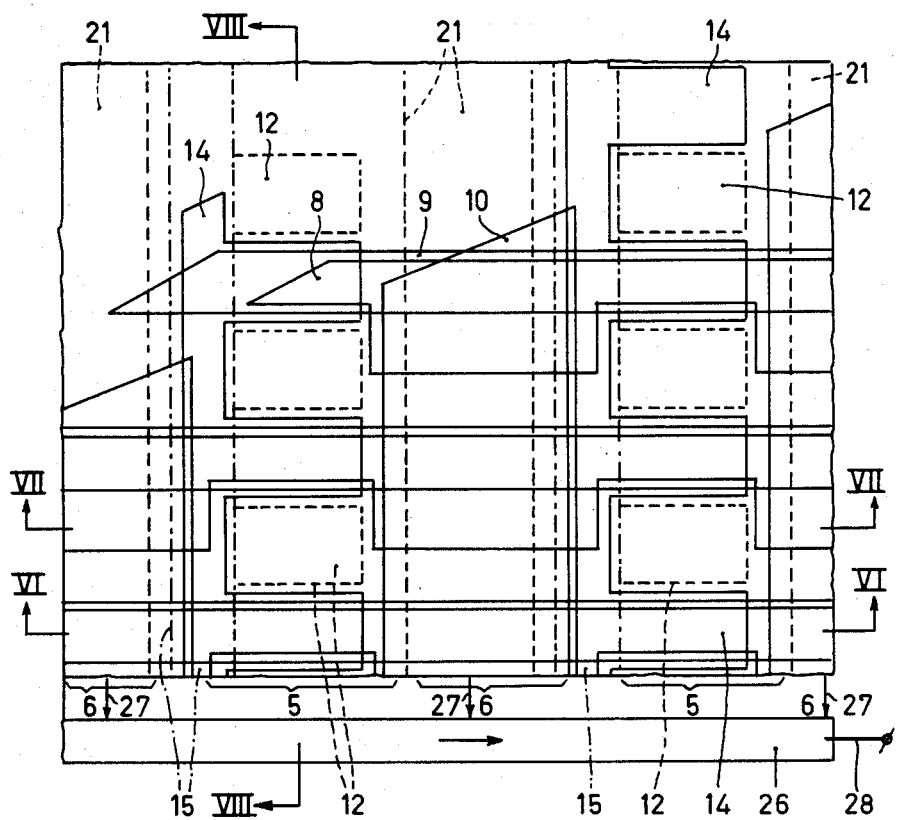
FIG. 5 is a plan view of a part of a two-dimensional embodiment of a picture pick-up device according to the invention.
Figure 6:
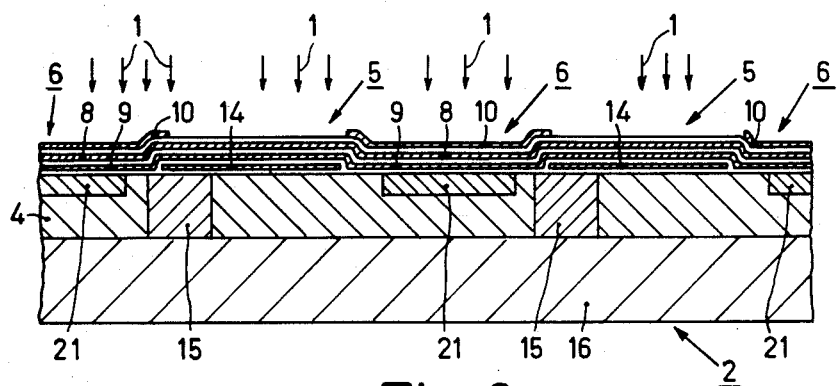
FIG. 6 is a cross-sectional view of this device taken on the line VI—VI.

The device comprises a number of substantially parallel rows or lines 5 of photosensitive elements which form a two-dimensional mosaic. FIG. 5, which is a plan view of a part of the device, shows to of such rows. By means of such a mosaic of photosensitive elements, a two-dimensional radiation image 1 can be converted into a two-dimensional pattern of charge packets each forming a measure of the intensity of the radiation which is incident locally on the device during a certain time, frame time. For reading out the charge packets, a number of charge transfer registers 6 are provided in the semiconductor layer 4 between the rows of photosensitive elements in such manner that beside each line 5 of photosensitive elements an associated charge transfer register 6 is present.

Just as in the preceding embodiment, the photosensitive elements each comprise a photodiode in the form of a p-type surface zone 12 provided in the n-type epitaxial layer 4 and an adjoining insulated gate electrode 14 which is provided beside the p-type zone 12 and on the insulating oxide layer 7 covering the surface 3. For reasons of clarity, the oxide layer 7 is not shown in the plan view of FIG. 5, while the p-type zones 12 are again denoted in broken lines in this Figure. The p-type zones 12 again comprise electric connections in the form of p-type regions 15 which extend from the surface 3 of the epitaxial layer 4 down to the p-type substrate 16. A suitable voltage, for example ground potential, can be applied to the p-type zones 12 via the substrate 16.

As shown in the plan view of FIG. 5 and in the cross-sectional view of FIG. 8, the insulated gate electrodes 14 are not placed beside the photodiodes 12 as in the line sensor according to the preceding embodiment, but between the photodiodes 12 so that the mutual distances between the photosensitive rows 5 can advantageously be comparatively small.

The charge transfer registers 6 consisting of charge-coupled devices with bulk transport are substantially identical to the charge-coupled device 6 in the device according to the preceding embodiment.

The electrodes which are denoted by reference numeral 10 each extend transversely across the surface of the charge-coupled devices and screen the charge-coupled devices against the radiation 1. The electrodes 10 can be connected together outside the part shown in the Figures. The electrodes 8 and 9 each extend in the form of a strip in a direction transverse to the charge transport directions across the semiconductor body 2 and constitute common electrodes for the number of charge-coupled devices 6. As shown in the plan view of FIG. 5, the electrodes 8 show narrowings at the area of the photosensitive elements 12 so that in the conductor pattern at the area of the p-type zones 12 apertures are obtained via which incident radiation can pentrate into the semiconductor material.

During operation, the same voltages as in the preceding example can be applied to the various zones and electrodes. The broken line 24 in FIG. 8 denotes the potential pattern which is formed in the semiconductor layer 4 at the area of a line 5 of photosensitive elements. The potential minima 25 below the electrodes 14 constitute storage spaces for electrons which are generated in and/or near the p-type zones 12. After the integration time the charge packets collected in the potential minima 25 are simultaneously transferred to the associated charge-coupled device. In known manner the charge packets may then be shifted to read-out members via the charge-coupled devices. These read-out members may comprise inter alia a further charge transport device 6 which is shown diagrammatically in FIG. 5. The devices 6 are each connected electrically to the register 26, which is shown diagrammatically by the arrows 27, which connections can be controlled by means of the electrodes 10. Via the connections 27 charge packets of the devices 6 can simultaneously be transferred to the register 26 and then, in known manner of charge transfer, be transported to the output 28 and be read out sequentially there. When all the charge packets have been read out, a following series of charge packets of the devices 6 can be transferred to the device 26 to be read out.

It will be obvious that the invention is not restricted to the embodiments described but that many variations are possible to those skilled in the art without departing from the scope of this invention.

Instead of an ohmic connection with the p-type surface regions 15 and the p-type substrate 16, the electric connections of the p-type zones 12 may also comprise a rectifying junction.

FIG. 9 is a cross-sectional view of such a device. This device corresponds generally, to the device described in the first embodiment and therefore again has the same reference numerals for convenience. An important difference from the device according to the first embodiment is that the p-type surface zones 12 are no longer connected to the p-type regions 15 but are separated herefrom laterally, as are also, of course, the p-type fingers 19 not shown. An n-type surface region 31 is provided in each p-type zone 12 and comprises a contact 32 for applying a suitable voltage. The n-type region 31 which forms the rectifying p-n junction 30 with the p-type zone 12 may be considered as the emitter of the phototransistor the p-type zone 12 of which forms the base zone and the underlying region of the epitaxial 4 forms the collector. During operation, with incident radiation, the junction 30 may inject electrons proportionally to the quantity of incident radiation. Said injected electrons can be collected below the gate electrode 14 in the manner already described. The advantage of such a structure is that the electrons generated by the absorption of radiation are intensified by the gain factor of the transistor so that the sensitivity of the device is considerablly increased.

Furthermore, the conductivity of the various zones and regions may be reversed. Also, instead of charge coupled devices with bulk transport, charge coupled devices with surface transport may be used in which the information-containing charge packets may be formed by generated holes instead of by electrons. Instead of charge-coupled devices, charge transfer registers of the bucket brigade register type may also be used.

What is claimed is:

1. An image sensor device for receiving a radiation image and converting the same into an electrical signal, comprising:
   a read out member;
   a semiconductor body including:
      a surface layer of mainly one conductivity type,
      a row of photosensitive elements for absorbing incident radiation and converting it into charge carriers which can be stored in the photosensitive elements during a frame time interval; and
      means for reading out the charge carriers stored in the photosensitive elements; said means comprising a charge transfer register having a barrier junction disposed on the surface of the layer, and a series of electrodes separated from the layer by the barrier junction and constituting with the underlying semiconductor material a series of capacitances in which the array of charge packets obtained in the photosensitive elements by generation of charge carriers can be shifted to the read-out member; and
   means for transfering the charge carriers of the photosensitive elements into the charge transfer register after each frame time interval;
   said photosensitive elements each comprising:
      a photodiode consisting of a surface zone formed in said surface layer, of a second conductivity type opposite to said one conductivity type and forming therewith a photosensitive p-n junction having a
   portion extending substantially parallel to the surface of the body; and
      a gate electrode, laterally adjacent each photodiode, comprising a conductive layer and an insulating layer separating said conductive layer from said surface layer, said conductive layer forming with the underlying material of the surface layer a capacitance in which charge obtained by the absorption of radiation in the photodiode during the frame interval can be stored before being transferred to the charge transfer register;
   wherein the surface layer has a thickness and doping concentration such that depletion regions can be formed in the surface layer at the areas of the photodiodes and the insulated gate electrodes, which regions extend through the thickness of the surface layer and form charge storage spaces for charge carriers which form majority charge carriers in the semiconductor material of said one conductivity type.

2. An image sensor device for receiving a radiation image and converting the same into an electric signal, comprising:
   a read out member;
   a semiconductor body including:
      a surface layer of mainly one conductivity type;
      a row of photosensitive elements for absorbing incident radiation and converting it into charge carriers which can be stored in the photosensitive elements during a frame time interval; and
      means for reading out the charge carriers stored in the photosensitive elements; said means comprising a charge transfer register having a barrier junction disposed on the surface of the layer and a series of electrodes separated from the layer by the barrier junction and constituting with the underlying semiconductor material a series of capacitances in which the array of charge packets obtained in the photosensitive elements by generation of charge carriers can be shifted to the read-out member; and means for transfering the charge carriers of the photosensitive elements into the charge transfer register after each frame time interval;

said photosensitive elements each comprising:

a photodiode consisting of a surface zone, formed in said surface layer, of a second conductivity type opposite to said one conductivity type and forming therewith a photosensitive p-n junction having a portion extending substantially parallel to the surface of the body; and a gate electrode, laterally adjacent each photodiode, comprising a conductive layer and an insulating layer separating said conductive layer from said surface layer, said conductive layer forming with the underlying material of the surface layer a capacitance in which charge obtained by the absorption of radiation in the photodiode during the frame interval can be stored before being transferred to the charge transfer register, wherein the surface zone and the gate electrode of each of the photosensitive elements comprise electric connections; and wherein the surface layer has a thickness and doping concentration such that depletion regions can be formed in the surface layer at the areas of the photodiodes and the insulated gate electrodes, which regions extend throughout the thickness of the surface layer and form charge storage spaces for charge carriers which form majority charge carriers in the semiconductor material of said one conductivity type.

3. An image sensor device as claimed in claim 1 or 2, wherein the semiconductor layer on the side opposite to the surface is bounded by a part of the semiconductor body constituting a substrate of the second conductivity type which forms a p-n junction with the semiconductor layer of the one conductivity type.

4. An image sensor device as claimed in claim 3, wherein the substrate forms part of the common electric connection of the surface zones of the second conductivity type.

5. An image sensor device for receiving a radiation image and converting the same into an electrical signal, comprising:

a read out member;

a semiconductor body including:

a surface layer of mainly one conductivity type;

a row of photosensitive elements for absorbing incident radiation and converting it into charge carriers which can be stored in the photosensitive elements during a frame time interval; and means for reading out the charge carriers stored in the photosensitive elements; said means comprising a charge transfer register having a barrier junction disposed on the surface of the layer and a series of electrodes separated from the layer by the barrier junction and constituting with the underlying semiconductor material a series of capacitances in which the array of charge packets obtained in the photosensitive elements by generation of charge carriers can be shifted to the read-out member; and means for transfering the charge carriers of the photosensitive elements into the charge transfer register after each frame time interval;

said photosensitive elements each comprising:

a photodiode consisting of a surface zone, formed in said surface layer, of a second conductivity type opposite to said one conductivity type and forming therewith a photosensitive p-n junction having a portion extending substantially parallel to the surface of the body;

and a gate electrode, laterally adjacent each photodiode, comprising a conductive layer and an insulating layer separating said conductive layer from said surface layer, said conductive layer forming with the underlying material of the surface layer a capacitance in which charge obtained by the absorption of radiation in the photodiode during the frame interval can be stored before being transferred to te charge transfer register, wherein said photodiode has an electrical connection which comprises a surface zone of the said one conductivity type provided in the surface zone of the second conductivity type and forming the emitter of a transistor structure, the base of which being formed by the surface zone of the second conductivity type and the collector by the surface layer of the one conductivity type.

* * * * *